United States Patent
Chino et al.

(10) Patent No.: US 8,934,006 B2
(45) Date of Patent: Jan. 13, 2015

(54) CHARGED-PARTICLE MICROSCOPE AND METHOD FOR CONTROLLING SAME

(75) Inventors: Hajime Chino, Mito (JP); Masaru Watahiki, Mito (JP); Toru Iwaya, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 456 days.

(21) Appl. No.: 13/511,810

(22) PCT Filed: Nov. 15, 2010

(86) PCT No.: PCT/JP2010/006685
§ 371 (c)(1),
(2), (4) Date: May 24, 2012

(87) PCT Pub. No.: WO2011/064960
PCT Pub. Date: Jun. 3, 2011

(65) Prior Publication Data
US 2012/0287257 A1    Nov. 15, 2012

(30) Foreign Application Priority Data
Nov. 26, 2009    (JP) .................... 2009-268289

(51) Int. Cl.
H04N 9/47       (2006.01)
H01J 37/26      (2006.01)
H01J 37/22      (2006.01)

(52) U.S. Cl.
CPC ............... *H01J 37/265* (2013.01); *H01J 37/22* (2013.01); *H01J 37/26* (2013.01)

USPC .......................................................... 348/80

(58) Field of Classification Search
CPC ....................... H01J 37/224; H01J 37/261
USPC ..................................... 348/80; 250/307, 310
See application file for complete search history.

(56) References Cited

U.S. PATENT DOCUMENTS
2007/0187595 A1    8/2007  Tanaka et al.

FOREIGN PATENT DOCUMENTS
CN          101553280          10/2009
(Continued)

OTHER PUBLICATIONS
International Search Report form International Application No. PCT/JP2010/006685 mailed Dec. 28, 2010.

*Primary Examiner* — Tung Vo
*Assistant Examiner* — Rowina Cattungal
(74) *Attorney, Agent, or Firm* — Brundidge & Stanger, P.C.

(57) ABSTRACT

The present invention provides an intuitive and easy-to-operate graphical user interface environment for charged-particle microscopes.

By restricting the operation items of charged-particle microscopes to the control button operations on GUI screen, excluding the charged-particle microscope specific technical terms, and unifying the observation conditions in the simple terminology with which the observation object can be intuitively understood, the operation environment which is intuitive and easy to understand for users not caring charged-particle microscopes is realized, and by restricting each of electron optical conditions in conjunction with the change of the observation condition to the fixed values and tabling them, it is possible to omit the operation workload of the user.

7 Claims, 9 Drawing Sheets

(56) References Cited

FOREIGN PATENT DOCUMENTS

| | | |
|---|---|---|
| JP | 54163669 | 12/1979 |
| JP | 05135726 | 6/1993 |
| JP | 2000-315472 | 11/2000 |
| JP | 2001216931 | 8/2001 |
| JP | 2004158392 | 6/2004 |
| JP | 2006-190567 | 7/2006 |
| JP | 2007-218711 | 8/2007 |
| JP | 2009-135273 | 6/2009 |
| WO | 2007035855 A2 | 3/2007 |

FIG.4

|  | ACCELERATION VOLTAGE | CURRENT AMOUNT | PROBE DIAMETER |
|---|---|---|---|
| SURFACE | LOW | SMALL | SMALL |
| REGULAR | HIGH | INTERMEDIATE | INTERMEDIATE |
| BRIGHTNESS | HIGH | LARGE | LARGE |

FIG.5

OBSERVATION CONDITION 1
・BUTTON NAME:SURFACE
・ACCELERATION VOLTAGE:VACC(0)
・FILAMENT CURRENT:IF(0)
・CONDENSER LENS:CI(0)
・ALIGNMENT:CAx(0), CAy(0)
・ASTIGMATISM COMPENSATION:STx(0), STy(0)

OBSERVATION CONDITION 2
・BUTTON NAME:REGULAR
・ACCELERATION VOLTAGE:VACC(1)
・FILAMENT CURRENT:IF(1)
・CONDENSER LENS:CI(1)
・ALIGNMENT:CAx(1), CAy(1)
・ASTIGMATISM COMPENSATION:STx(1), STy(1)

OBSERVATION CONDITION 3
・BUTTON NAME:BRIGHTNESS
・ACCELERATION VOLTAGE:VACC(2)
・FILAMENT CURRENT:IF(2)
・CONDENSER LENS:CI(2)
・ALIGNMENT:CAx(2), CAy(2)
・ASTIGMATISM COMPENSATION:STx(2), STy(2)

FIG.8A

PC SIDE COMMAND TRANSMISSION TABLE

| ADJUSTMENT ITEM | HIGH-ORDER BIT ← SET-UP VALUE → LOW-ORDER BIT | | | | |
|---|---|---|---|---|---|
| 1 (ACCELERATION VOLTAGE) | 0 | 0 | 0 | 0 | 0 |
| 2 (FILAMENT CURRENT) | 0 | 0 | 0 | 0 | 0 |
| 3 (CONDENSER LENS) | 8 | A | B | 7 | F |
| 4 (ALIGNMENT COIL) | 0 | 0 | 0 | 0 | 0 |
| 5 (ASTIGMATISM COMPENSATION) | 0 | 0 | 0 | 0 | 0 |

FIG.8B

CONTROL MICROCOMPUTER SIDE COMMAND RECEPTION TABLE (BEFORE REWRITING)

| ADJUSTMENT ITEM | HIGH-ORDER BIT ← SET-UP VALUE → LOW-ORDER BIT | | | | |
|---|---|---|---|---|---|
| 1 (ACCELERATION VOLTAGE) | 0 | 0 | 0 | 0 | 0 |
| 2 (FILAMENT CURRENT) | 0 | 0 | 0 | 0 | 0 |
| 3 (CONDENSER LENS) | 0 | 0 | 0 | 0 | 0 |
| 4 (ALIGNMENT COIL) | 0 | 0 | 0 | 0 | 0 |
| 5 (ASTIGMATISM COMPENSATION) | 0 | 0 | 0 | 0 | 0 |

FIG.8C

CONTROL MICROCOMPUTER SIDE COMMAND RECEPTION TABLE (AFTER REWRITING)

| ADJUSTMENT ITEM | HIGH-ORDER BIT ← SET-UP VALUE → LOW-ORDER BIT | | | | |
|---|---|---|---|---|---|
| 1 (ACCELERATION VOLTAGE) | 0 | 0 | 0 | 0 | 0 |
| 2 (FILAMENT CURRENT) | 0 | 0 | 0 | 0 | 0 |
| 3 (CONDENSER LENS) | 8 | A | B | 7 | F |
| 4 (ALIGNMENT COIL) | 0 | 0 | 0 | 0 | 0 |
| 5 (ASTIGMATISM COMPENSATION) | 0 | 0 | 0 | 0 | 0 |

CHARGED-PARTICLE MICROSCOPE AND METHOD FOR CONTROLLING SAME

TECHNICAL FIELD

The present invention relates to a charged-particle microscope having a change function of an observation condition by an easy button operation utilizing a graphical user interface (hereinafter, abbreviated as GUI) and a control method for the same.

BACKGROUND ART

Conventionally, users of charged-particle microscopes or various devices which applied charged-particle microscope were limited to so-called specialists such as researchers in research institutions, production controllers in manufacturing industries, or analysts. However, due to the recent technological progress, it has become possible to realize charged-particle microscopes which are very in-expensive for the performance, and correspondingly, charged-particle microscopes are being introduced to locations such as education fields of elementary, junior-high schools and the like, or auto-repair factories, which were not assumable at all in the past. The users of the charged-particle microscopes in such locations are not technical specialists, therefore, for the aforementioned in-expensive charged-particle microscopes, the easy operability is rather required more than the performance.

On the other hand, for example, as described in Patent Literature 1, recently, GUI introductions have been progressed even to the charged-particle microscope, and it is possible to perform most of the operations through GUI screens displayed on monitors. Consequently, it is possible to mention that current charged-particle microscopes are considerably improved, compared to the one-decade-previous charged-particle microscopes, in the operability.

PRIOR ART REFERENCE

Patent Literature

[Patent Literature 1] JP 2006-190567 A

SUMMARY OF THE INVENTION

Problems to be Solved by the Invention

GUI screens used in the conventional charged-particle microscopes are designed on the assumption of the technical specialists' utilization. Consequently, operation set-up screens of the devices displayed on the GUI have followed operation set-up items, operation adjustment items, or set-up sequences in which the specialists performed manual operations in the past, just as they are, and have been replaced with GUI screens. Therefore, there are a great number of set-up items and adjustment items displayed on the GUI, furthermore, control parameters to be set up in a certain set-up item and control parameters to be set up in the other set-up item are closely related mutually, and the adjustment is highly complicated.

For example, it is possible for the charged-particle microscopes to acquire images in different observation conditions, such as images furthermore reflecting surface shapes of the observation samples or images furthermore reflecting compositions in the observation samples, by switching the irradiation condition of the primary charged-particle beam. However, in order to adjust the device in the required observation condition, for example, if the acceleration voltage of the electron source is changed, the change works of the other conditions of the charged-particle optical system such as electron lens, polariscope adjustment or the like, are generated in conjunction with the acceleration voltage change.

Moreover, operation set-up items or operation adjustment items displayed on the conventional GUI screens are displayed in charged-particle microscope specific technical terms.

Consequently, it is considerably hard to mention that the users without the background knowledge regarding charged-particle microscopes can easily operate the GUI screens utilized in the conventional charged-particle microscopes, and there exists a problem that a highly long time is required for the device users to become used to the operation.

Therefore, an object of the present invention is to realize charged-particle microscopes which comprise intuitive user interfaces with the superior operability, and are easy to operate like home appliances such as television sets or compact digital cameras.

Means for Solving the Problem

In order to realize user interfaces which are operable without the professional knowledge of the charged-particle optical system, objects such as buttons, icons or the like displayed on the GUI have excluded technical terms, and have taken only the common vocabulary intuitively indicating the utilization purpose of the device user, for example, the common vocabulary such as "visual field search", "image confirmation", "focus (adjustment)", "observation magnification (change)", "observation condition (change)" or the like.

Furthermore, a means to execute, as a whole, a series of processes required to achieve the users' utilization purpose shown by buttons and icons has been provided.

Effect of the Invention

Intuitive user interfaces with the superior operability have been realized, and also charged-particle microscopes which are operable even for beginners without the professional knowledge regarding the charged-particle microscope have been realized.

BRIEF DESCRIPTION OF THE DRAWINGS

FIG. 4 is a drawing showing a relation of an observation condition mode and an operating condition of the charged-particle optical system;

FIG. 5 is a drawing showing a configuration example of an observation condition file;

FIGS. 8A-8C are drawings showing configuration examples of command tables; and

MODES FOR CARRYING OUT THE INVENTION (Embodiment 1)

Hereinafter, an embodiment 1 will be described with reference to the drawings.

Figure 1:
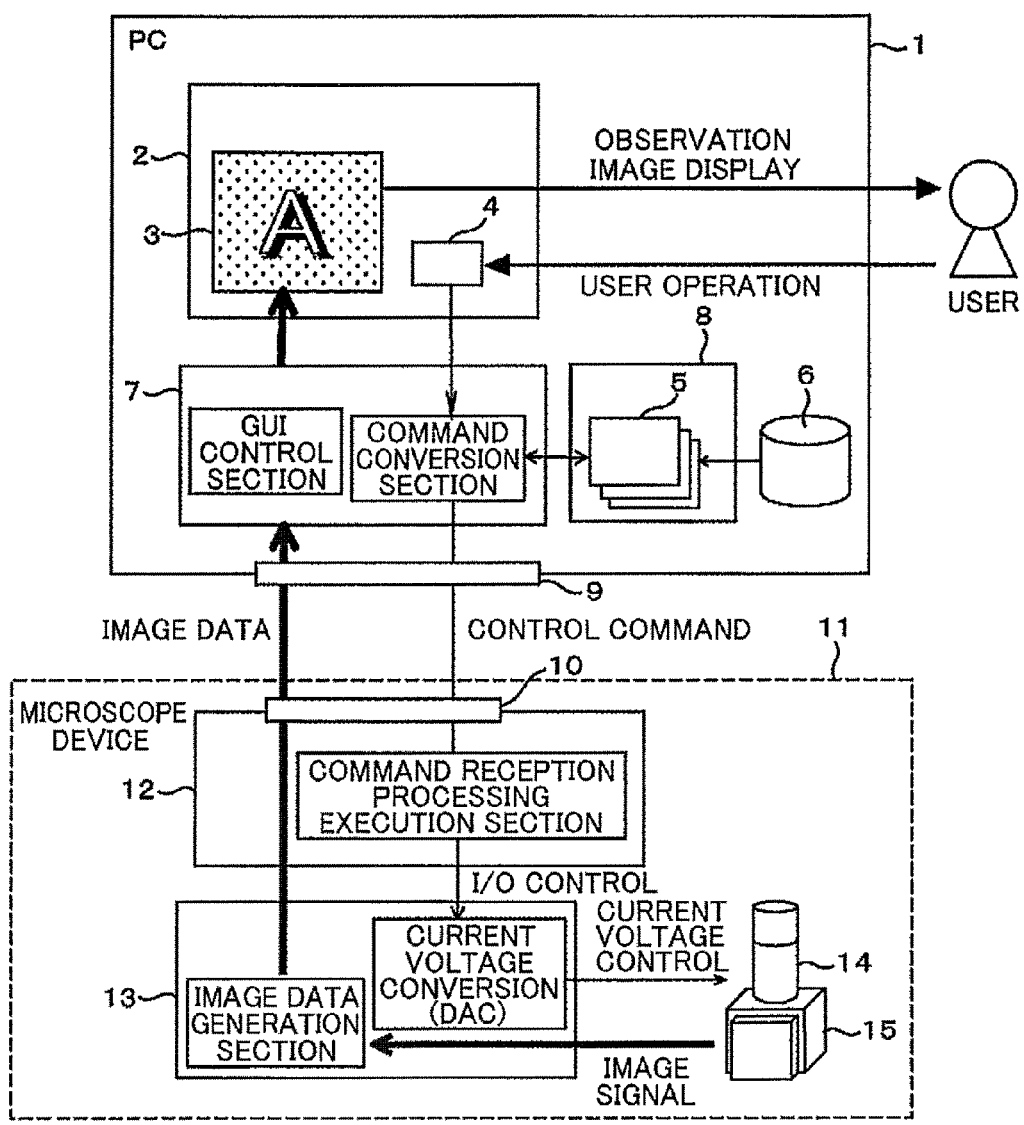
FIG. 1 is an entire configuration drawing of a charged-particle microscope system in one embodiment of the present invention.

FIG. 1 shows an entire system configuration of the charged-particle microscope of the embodiment. The charged-particle microscope system shown in FIG. 1 comprises a microscope device 11 for actually observing the sample and personal computer 1 (hereinafter, abbreviated as PC) for realizing the user interface function for the microscope device.

The charged-particle microscope device 11 includes a microscope body comprising a charged-particle optical minor body 14 having a function for irradiating primary electron beams to the observed sample and for detecting the secondary charged-particles and a sample chamber 15 for storing the aforementioned observed sample, a control circuit 13 for controlling control current or control voltage values to be supplied to the microscope body, an upper control device 12 for further controlling the control circuit 13, a communication terminal 10 connected to the communication line in order to connect to the aforementioned PC, or the like.

The upper device 12 comprises a memory in which programs for controlling the control device 13 are stored and a processor for executing the programs.

The control circuit 13 comprises a digital-analog converter (DAC: Digital Analog Converter) for replacing digital control signals transmitted from the upper device 12 with control currents or control voltages of the charged-particle optical system and a logical circuit for controlling the DAC. The control circuit 13 comprises FPGAs because of advantages of the circuit miniaturization, the flexible changeability of circuit configurations or the like.

PC1 includes a GUI screen 2 for displaying images picked up by the microscope body or operation screens of the microscope body, a processor 7 for processing various information controlled on the PC 1, a memory 8 for storing software executed by a processor 1901, moreover, a secondary storage device 6 for storing the software and the data not to be utilized immediately by the processor, a communication terminal 9 to connect a communication line for connecting to the aforementioned microscope device 11, or the like. In the memory 8, observation condition tables to be described later are stored, and referred to by the processor 7 when interpreting the condition which was input by the GUI to the control condition of the control circuit 13. In the actual product forms, general-purpose personal computers prepared by the device users are utilized as PC, and the control functions of the charged-particle microscope device are realized by installing the observation condition tables, and other required software, afterwards.

Figure 2:
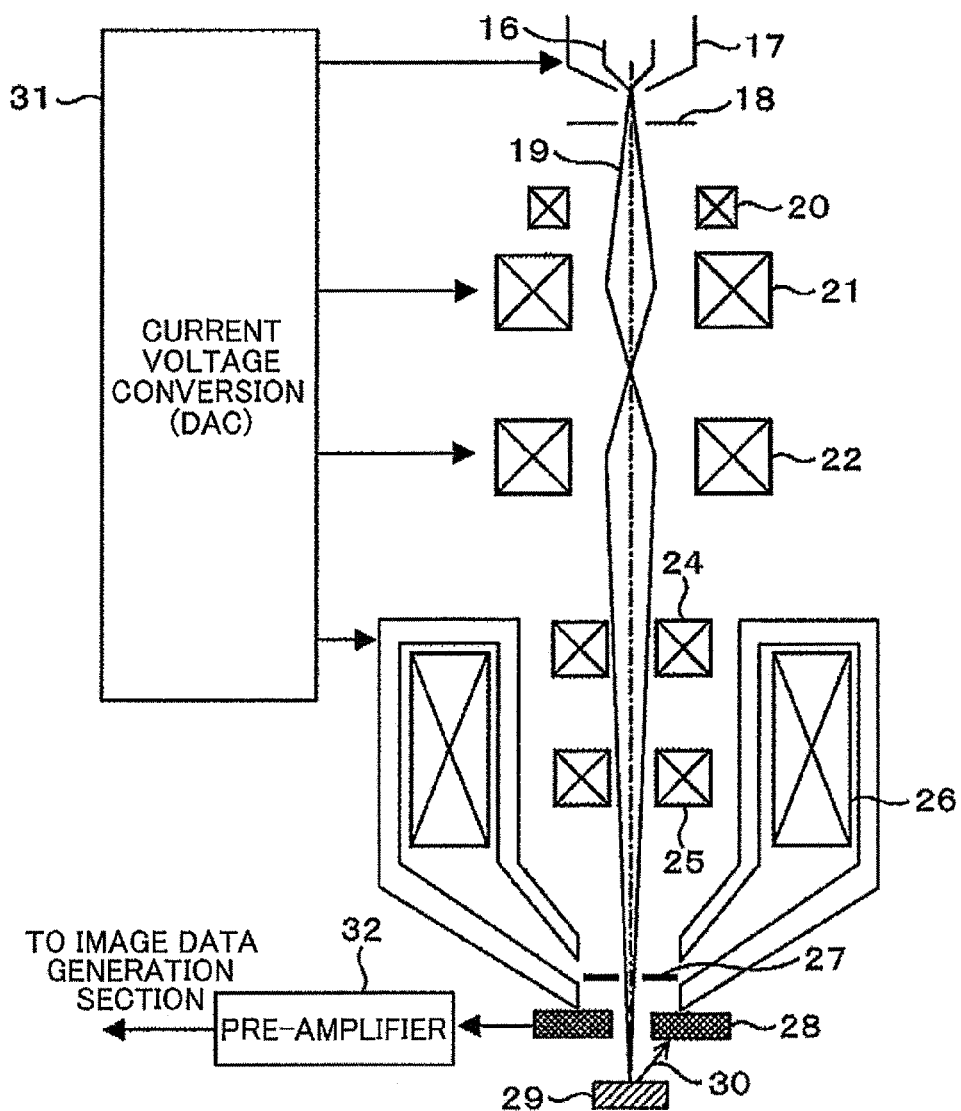
FIG. 2 is a schematic drawing showing an interior configuration example of a charged-particle mirror body in the embodiment of the present invention.

FIG. 2 has shown the outline regarding the interior configuration of the charged-particle optical minor body 14. The charged-particle optical mirror body 14 of the charged-particle microscope of the embodiment comprises a charged-particle radiation source 16 for generating charged-particle beams, a cathode 17 for drawing charged-particles generated by the charged-particle radiation source 16, an anode 18 for accelerating the drawn charged-particle beam with the prescribed energy and radiating to a sample 29 side as a primary charged-particle beam 19, an alignment coil 20 for executing the optical axis adjustment of the primary charged-particle beam 19, focusing lenses (a first condenser lens 21 and a second condenser lens 22) for adjusting the beam current amount and the beam opening-angle, a scan coil 24 for executing the scan of the primary charged-particle beam, an astigmatism compensation coil 25 for excluding the astigmatism component included in the primary charged-particle beam at the beam landing position on the sample, an object lens 26 for converging the primary charged-particle beam on the sample, a beam current diaphragm 27, a BSE detector 28 for detecting scattering electron 30 generated by the irradiation of the primary charged-particle beam, or the like.

In the case that the focusing lens is of the strong excitation, since the charged-particle beam is focused, the probe diameter of the charged-particle beam (charged-particle beam 13) becomes smaller and the current becomes less. Therefore, the probe diameter of the charged-particle beam injected to the observation sample 29 becomes smaller and the resolution becomes higher, thus, it is possible to acquire the high-definition observation images reflecting the surface shape of the observation sample.

In the condition that the focusing lens is of the strong excitation, when the acceleration voltage is set higher, the injection angle to the observation sample 29 becomes an acute angle, therefore, a scattering electron 23 including the sample composition information is generated from the observation sample interior. Accordingly, the observation images become the images including the sample interior composition information.

To the contrary, in the case that the focusing lens is of the weak excitation, the probe diameter of the charged-particle beam becomes larger and the current increases. Therefore, the probe diameter of the charged-particle beam injected to the observation sample 29 becomes larger, thus, the resolution decreases and the blurred observation images are caused. However, since there is a great amount of the current injected to the observation sample, a great number of scattering electrons 23 can be generated. Moreover, since a great amount of specific X ray included in the observation sample is generated, the observation images become the images suitable for the analysis use.

The charged-particle microscope of the embodiment adopts the low-vacuum-method SEM which is suitable for an in-expensive SEM, since the structure of the vacuum sample chamber can be made simple. The low vacuum SEM is an SEM which is made possible to set the pressure in the sample chamber up to dozens through several hundreds of Pa, the BSE detector or the ESD detector (gas amplification secondary electron detector) is utilized as a detector.

Figure 3:
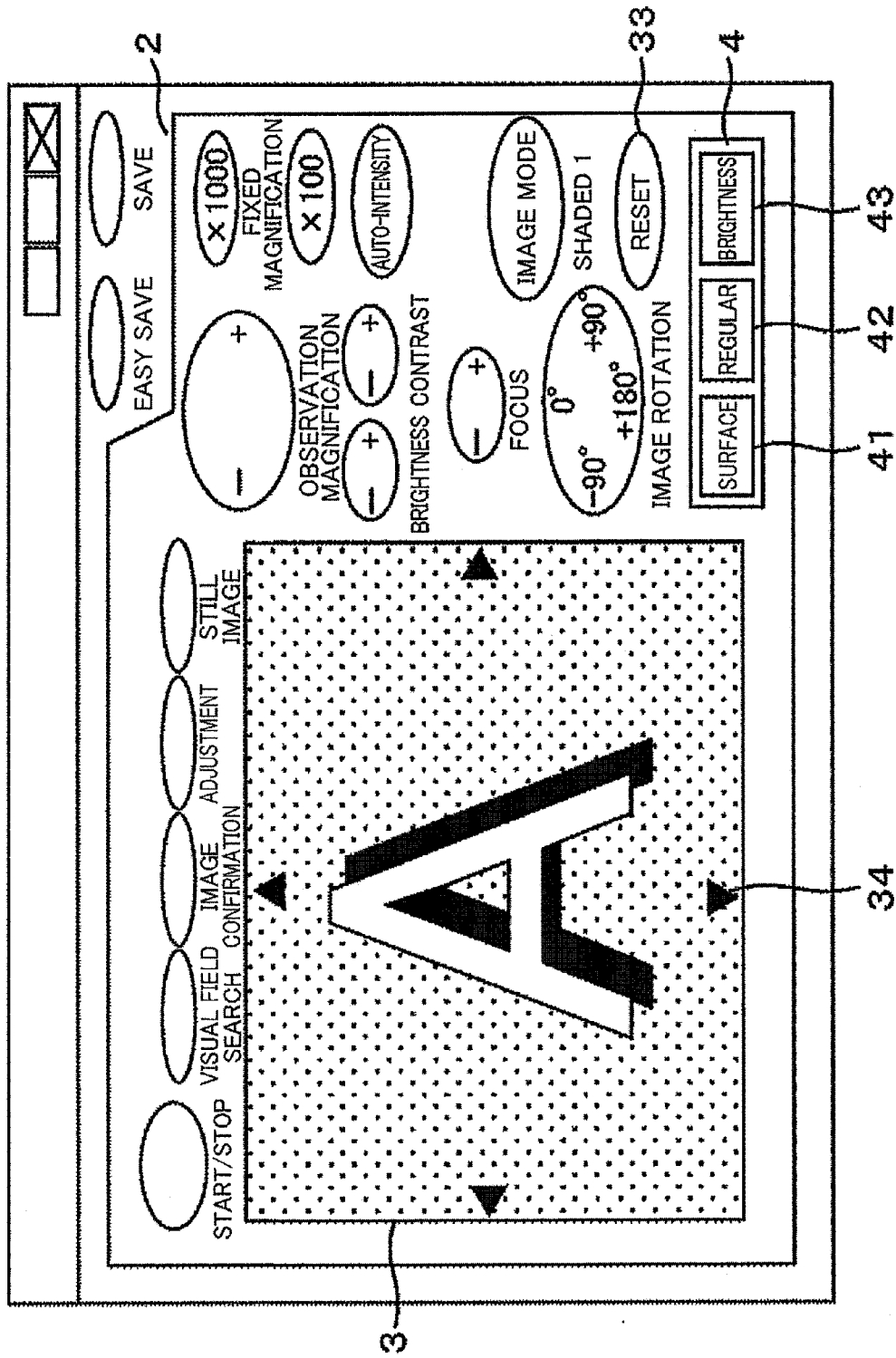
FIG. 3 is a configuration example of an operation screen of the charged-particle microscope system in the embodiment of the present invention.

FIG. 3 shows one example of the operation screen displayed on the GUI screen 2 shown in FIG. 1. On the GUI screen shown in FIG. 3, buttons of "start/stop", "visual field search", "image confirmation", "adjustment", "still image" or the like are displayed. The "start/stop" button is a button for switching on and off the acceleration voltage of the charged-particle optical mirror body. Moreover, actually, the displays of the "start" and "stop" of the "start/stop" button are made to be switched according to the on/off condition of the acceleration voltage. This is because the users' visibility has been considered. The "visual field search" button is a button to be pressed when the visual field of the display image is moved, and in the condition that this button is pressed, when the visual field movement button 34 displayed up and down, left and right on the GUI screen is pressed, the visual field of the microscope moves to the arrow direction. This visual field movement is executed by the movement of the sample stage which is not shown. In the condition that the "visual field search" button is pressed, the fast beam scan is executed, and the displayed observation image becomes rough, however, it is possible to follow the movement of the visual field, accordingly, the stage can be moved while confirming the observation image.

When the "image confirmation" button is selected, the slow beam scan is executed, and the high-definition images are displayed on the observation image 3. The "adjustment" button is a button to be pressed when it is desired to adjust the charged-particle optical mirror body such as the focus adjustment, the astigmatism compensation or the like, and when the "adjustment" button is selected, the beam scan domain size is set up narrower than the scan domain in the case the "image confirmation" is pressed, and also the fast scan is executed. When the "still image" button is selected, the beam scan becomes in the still condition, and the last scanned image is displayed on the GUI screen (the last scanned one-frame memory image keeps on being displayed).

The "observation magnification" button is a button for adjusting the visual field magnification of the observation image, and the visual field magnification increases and decreases according to the + − symbols. The "fixed magnification" button in the right of the "observation magnification" button is a button for auto-setting-up the visual field magnification in the prescribed fixed value, and 2 values of the one-thousand-times and the one-hundred-times are prepared on the GUI screen shown in FIG. 3. Each button of "brightness" and "contrast" is a button for increasing and decreasing the brightness and the contrast of the display image according to the + − symbols, similarly. The "auto-intensity" is a button for auto-adjusting the adjustment of the "brightness" and "contrast" according to the default reference held by the microscope device 11. The "focus" button is a button for moving the in-focus point position of the primary charged-particle beam irradiated to the sample to the over-focus side and the under-focus side according to the + − symbols. The "reset" button 45 is a button for returning the moved visual field back to the original position.

Subsequently, the change function of the observation condition will be described with reference to FIG. 1 through FIG. 3 described above. As shown in FIG. 1, the observation condition button 4 is displayed on the operation screen of the charged-particle microscope system of the embodiment. As the details are shown in FIG. 3, the observation condition button 4 comprises each button of "surface" button 41, "regular" button 42, and "brightness" button 43. The device user can switch to the observation condition mode in accordance with the observation purpose, by clicking each observation condition button 4 of "surface", "regular", and "brightness" arranged on the GUI screen 2, during the image observation of the charged-particle microscope. The operating condition of the charged-particle optical system in conjunction with the mode switching is automatically changed by the charged-particle microscope system. The button display is lit on for the currently selected observation condition mode, for being distinguished from the non-selected observation condition button. Moreover, the selected observation condition button 4 is stored on the PC when the PC application program is completed, and the selection condition of the previous observation condition mode is reproduced when re-booting the PC application program.

In the charged-particle microscope system of the embodiment, the "observation condition" means the image acquisition condition for acquiring the images including a great amount of specific information of the sample as below, and these observation conditions can be changed by adjusting the beam acceleration voltage, the beam current amount, and the beam probe diameter (beam spot diameter of the primary charged-particle beam to reach the top of the sample). For example, the "surface" means the observation image including a great amount of the surface shape information of the observation sample, and the "regular" means the observation image including a great amount of composition information of the observation sample. In the case that the low acceleration voltage, that is to say, the low-energy electron beam is injected to the observation sample 29, the scattering electron 23 is generated from the vicinity of the surface of the observation sample and a great amount of surface shape information of the sample is included in the observation image. To the contrary, in the case that the high acceleration voltage, that is to say, the high-energy electron beam is injected to the observation sample 29, the scattering electron 23 is generated from the observation sample interior and the signal acquired from the detector 28 becomes the observation image including a great amount of composition information of the observation sample. In the image acquisition condition of the "regular" mode, the observation image acquired by increasing the beam probe diameter is the "brightness", and the observation image becomes brighter than the image of the "regular" observation condition mode, therefore, the observation condition mode is expressed as "brightness". Since the probe diameter is increased, the image resolution is decreased, however, the large irradiation current amount can be taken, therefore, it is suitable for the EDX (Energy Dispersive X-ray Spectroscopy) analysis, and in the case that the X ray analysis equipment is connected, the "brightness" button is changed to "analysis" and displayed.

The correspondence relation of each observation condition and the operating condition of the charged-particle optical system described above is shown as a whole in FIG. 4. For example, in the case of the embodiment, the acceleration voltage of 5 kV for the "surface" observation condition mode, and the acceleration voltage of 15 kV for the "regular" observation condition mode and "brightness" observation condition mode are adopted. Incidentally, the relation such as "low", "high", "large", "intermediate", and "small" shown in FIG. 4 is a relative comparison among observation conditions of "surface", "regular", and "brightness", and doesn't mean that the absolute values of the acceleration voltage and the beam current amount are large or small.

By selecting each observation condition mode, it is required to adjust each item of the acceleration voltage, the beam current amount, the probe diameter, however, actually, it is required to adjust the other items, incidentally to that. The GUI of the conventional charged-particle microscopes was designed to individually adjust each aforementioned item, therefore, the operability was highly deteriorated, however, in the charged-particle microscope system of the embodiment, the adjustment items of the charged-particle optical system generated incidentally to the selection of each observation condition mode are stored in the memory 8 or in the secondary storage device 6 as an "observation condition file" as a whole.

Therefore, the adjustment works and observation condition files which are generated incidentally to the acceleration voltage, the beam current amount, and the probe diameter will be described below.

Firstly, the aforementioned "adjustment work incidentally generated" is described. In the case of the embodiment, the acceleration voltage is adjusted to be 5 kV in the "surface" observation mode, and the acceleration voltage is adjusted to be 15 kV in the "regular" observation condition mode and the "brightness" observation condition mode. The acceleration voltage is adjusted by changing the potential difference of the cathode 17 and the anode 18. Moreover, in the case of the "brightness" observation mode, the beam current amount is made to be larger than two other conditions, though being fixed usually.

When the acceleration voltage of the charged-particle radiation source 16 is changed, the axis deviations are generated in two directions, the perpendicular direction and the horizontal direction of the cross-over point (image-formation position of beam probe) of the charged-particle beam 13 to the optical axis, on the focusing lens surface. The axis deviation in the perpendicular direction is required to be corrected by adjusting the focusing lens 21 or 22, and the axis deviation in the horizontal direction is required to be corrected by adjusting the alignment coil 20, consequently, the adjustments of the focusing lens and the alignment coil are required due to the change of the acceleration voltage.

Furthermore, when the charged-particle radiation source current is increased in order to increase the beam current amount, the probe diameter is increased by Coulomb effect. In order to generate the primary charged-particle beam of the required probe diameter, the opening-angle is required to be adjusted by adjusting the condenser lens.

Moreover, when the acceleration voltage, the beam current amount, and the probe diameter are changed by changing the observation condition, the astigmatism of the different amount appears. Consequently, in conjunction with the change of the observation condition, the astigmatism compensation coil 25 to correct the astigmatism is required to be adjusted.

As aforementioned, when the observation condition is changed, not only adjustments of the acceleration voltage and the charged-particle radiation source, but also the adjustment works of each configuration element of the charged-particle optical system such as the condenser lens, the alignment coil, and the astigmatism compensation coil, are generated. The GUI of the conventional charged-particle microscopes was designed so that the adjustment of each of these configuration elements could be executed individually per element. In the case that the device user is a specialist, it is rather better to be capable of adjusting each configuration element individually, because of the requirement to make adjustments to draw the highest performance of the device in accordance with the observation object. However, in the case that the device user is not a specialist, it is better to have the device auto-execute by grouping the adjustment works of each of the configuration elements of the related charged-particle optical system per the targeted observation condition, so that the user cannot feel the workload.

Therefore, the charged-particle microscope system of the embodiment has introduced a concept which is the observation condition file and has been made to describe the adjustment works of the charged-particle optical system required at minimum in order to execute the image acquisition in the prescribed observation condition, in the observation condition file. When a certain observation condition is specified by the operation screen on the GUI, the PC side reads out the observation condition file which agrees with the specified observation condition, converts the contents described in the file to the control command which can be understood by the upper control device 12 shown in FIG. 1, and makes a transmission to the charged-particle microscope device 11 side. This makes it possible to complete the mutually related adjustment works with a one-time operation on the GUI, thus, the charged-particle microscope system which can be easily operated even by the non-specialist user is realized.

FIG. 5 shows a configuration example of an observation condition file of the embodiment. Three tables of the table 1 through 3 are prepared in accordance with each observation condition of "surface", "regular", and "brightness", and on each table, descriptions are made for each of the values of the acceleration voltage, the filament current (charged-particle source current), the operating condition of the condenser lens, the supply current value to the alignment coil, and the supply current value to the astigmatism compensation coil which are adjustment items of the charged-particle optical system to be set up at minimum in each observation condition.

In some cases, the observation images displayed after the change of the observation condition are remarkably changed in the intensity, compared to the observation images before the change. In such cases, by pressing the "auto-intensity" button displayed in the right of the GUI screen, the auto-adjustments (ABCC: Auto Brightness Contrast Control) of the brightness and the contrast are executed. In the right of the "auto-intensity" button, + and − buttons are located to manually adjust the brightness and the contrast respectively, and this is because it is desired to individually change either of the brightness or the contrast and to adjust the picture quality, in some cases.

Specifically, ABCC is executed by adjusting the gain of the amplifier connected to the BSE detector. Incidentally, the embodiment doesn't include the adjustment sequences of the brightness and the contrast in the observation condition files. This is because the adjustments executed by ABCC are the adjustments which make the brightness and the contrast of the observation image after the observation condition change, closer to the brightness and the contrast of the observation image before the change, consequently, the gain adjustment amount of the pre-amplifier is not fixed, without acquiring the image once. In addition, this is also because the intensity of the observation image isn't greatly changed, before and after the observation condition change, in some cases.

Therefore, the signal data of the secondary charged-particle signal acquired by the observation condition before the change is stored in the memory 8 until the observation condition is changed next time, called upon the ABCC executed after the observation condition change, and compared with the intensity value (signal strength) of the secondary charged-particle signal acquired after the observation condition change. This makes the gain adjustment amount of the pre-amplifier fixed and the brightness and the contrast of the observation image are appropriately adjusted.

Incidentally, needless to say, it is also possible to describe the auto-adjustment sequences of the brightness and the contrast in the observation condition files, and in that case, it is sufficient to add a new file describing the ABCC execution sequences (for example, called ABCC execution file) to the observation condition file, and to add a condition to "refer to the ABCC execution file" in the end of each of existing observation condition tables of "surface", "regular", and "brightness".

Figure 6:
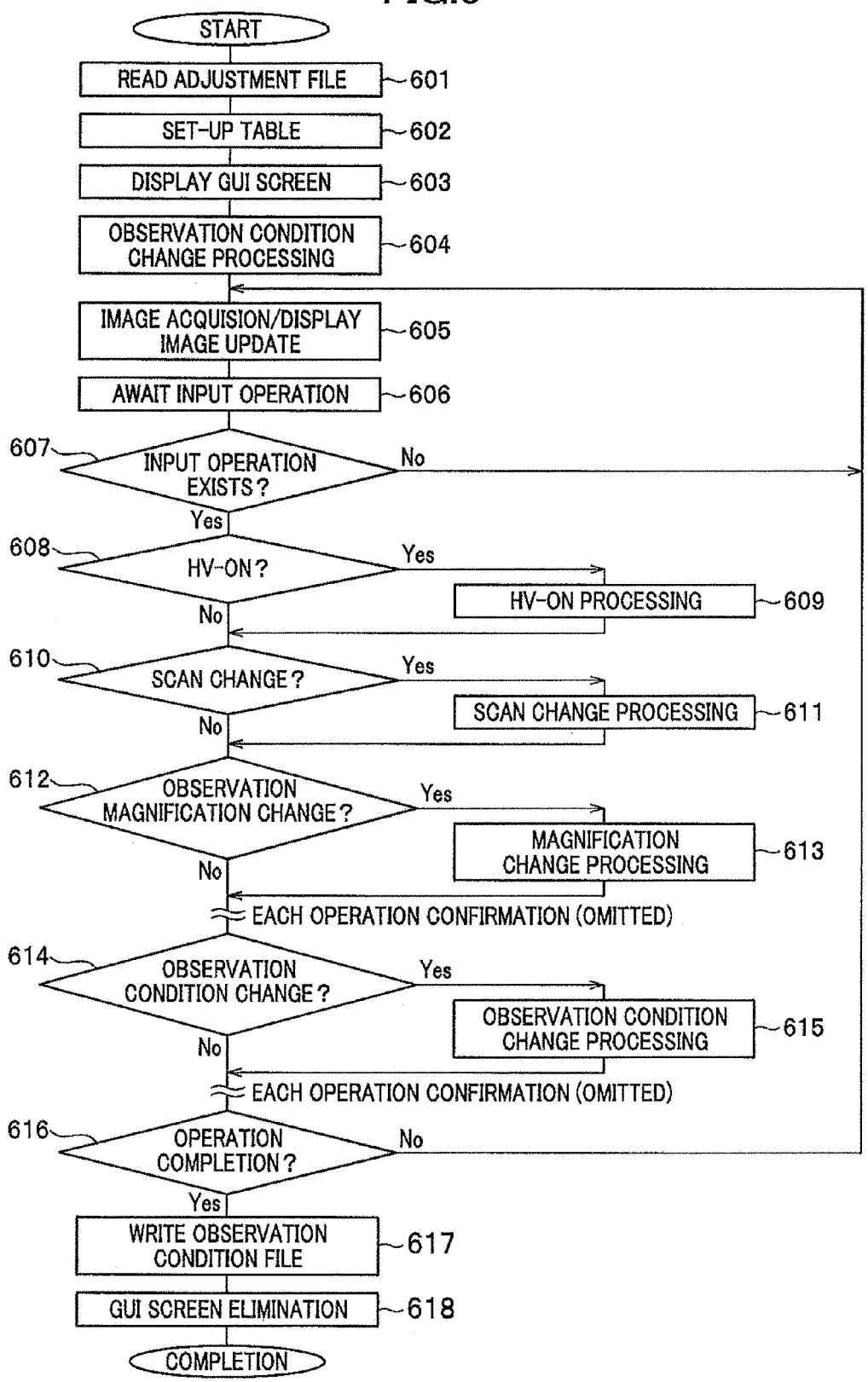
FIG. 6 is an entire operation flow chart of the charged-particle microscope system in the embodiment of the present invention.

Next, the operation of the charged-particle microscope system of the embodiment is described with reference to FIGS. 6-8C. First, FIG. 6 is an entire operation flow chart of the charged-particle microscope system of the embodiment.

When the PC1 and the charged-particle microscope device 11 are powered on and the system is booted up, first, the observation condition file 5 is read from the secondary storage device 6 to the memory 8 (S601), and the observation condition table is set up (S602). Next, the GUI screen is displayed on the PC display (S603), and there will be a condition to wait for the specifying of the observation condition of the device user. When the observation condition is specified on the GUI (S604), the image acquisition processing is executed in the specified observation condition, and the observation image is displayed in the image display domain on the GUI (S605). Thereafter, the charged-particle microscope system performs the loop between the input waiting condition (S606) which is an idle condition and the confirmation step (S607) of the existence of the input operation, however, the observation image keeps on being displayed on the screen.

If some operation is performed on the GUI screen, the flow transitions to the downstream side of S607, and the confirmation sequence of the operating condition of the charged-particle optical system is executed (S608 through S613). In the beginning of a series of confirmation sequences, the emission condition of the charged-particle radiation source and the acceleration voltage are checked (S608), and in the case that the acceleration voltage is dropped, the processing (S609) to restore the acceleration voltage to the prescribed value is executed. Thereafter, each check of the change existence check (S610) of the scan condition, and the change existence check (S612) of the observation magnification is executed, and in the case that there is a change, the prescribed change processing is performed in the step 611 or the step 613. The "scan condition change" means the change of the scan condition upon each of button operations of "image confirmation", "adjustment", and "still image" shown in FIG. 3.

Once the confirmation sequence of the operating condition of the charged-particle optical system is completed, the determination step to determine whether the condition being input in S607 changes the observation condition or not is executed (S614), and in the case that it changes the observation condition, the change control to the observation condition being input on by GUI is executed (S615), and in addition, the judgment step to judge whether it is the operation completion or not is executed (S616). In the case that the determination result in S614 doesn't change the observation condition, S616 is immediately executed.

In the case that the determination result of S616 doesn't show the operation completion, back to S605, the image is acquired in the observation condition after the change and displayed in the observation image display domain on the GUI. In the case of the operation completion, the data of the operating condition of the charged-particle optical system at present and of the specified observation condition is written in the secondary storage device 6 (S617) and the system is shut down. On this occasion, the display on the GUI screen also disappears (S618). The aforementioned condition written in the secondary storage device is referred to and the observation condition mode upon the last completion is restored, when the system is booted up next time.

Next, the change processing of the observation condition executed in step 615 will be described in detail with reference to FIG. 7 and FIGS. 8A-8C.

Figure 7:
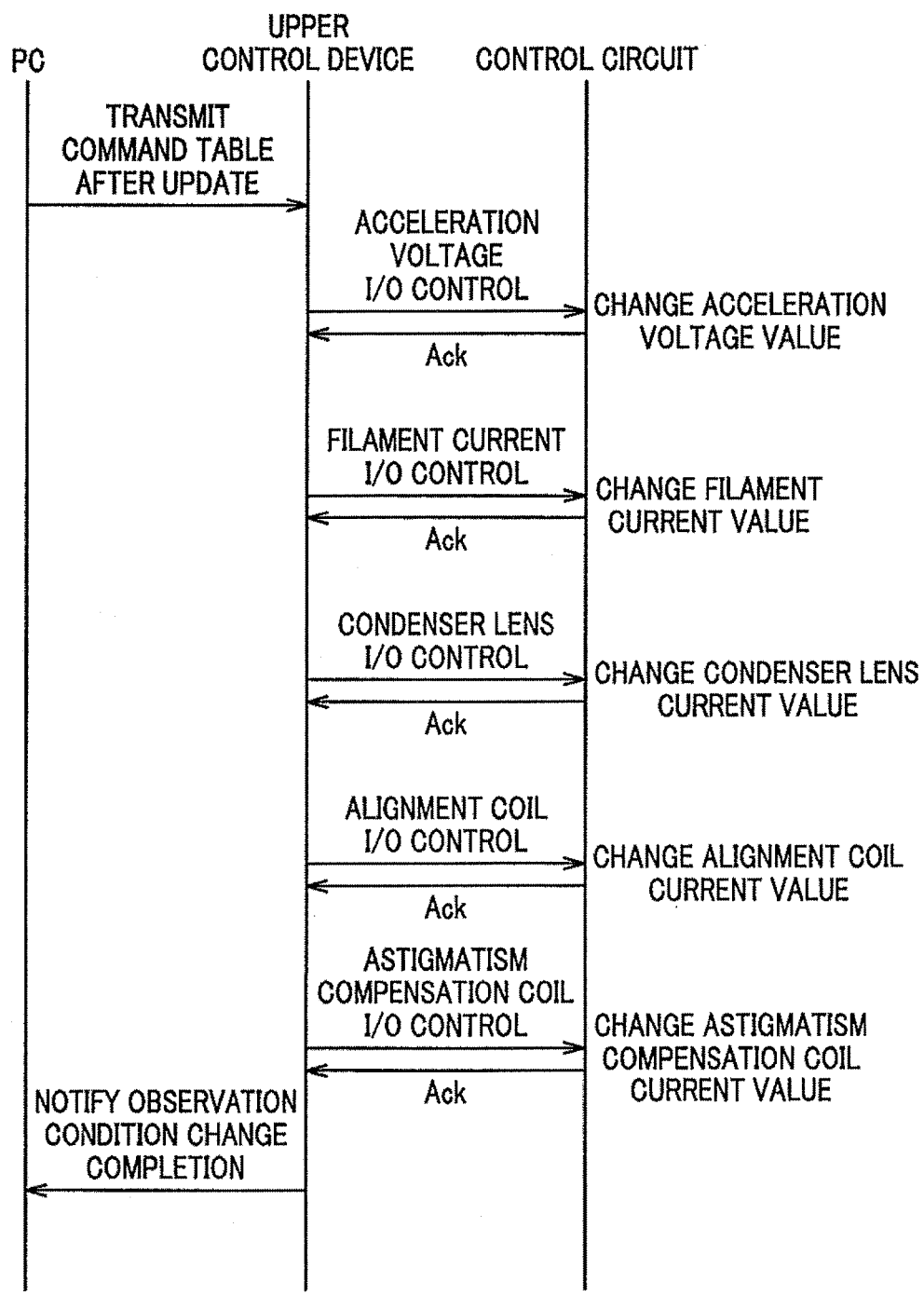
FIG. 7 is a drawing showing a cooperative operation among application programs, upper control devices, and control circuits.

FIG. 7 shows the details of the observation condition change processing executed in step 615 of FIG. 6 on the timing chart among the PC1-upper control device 12-control circuit 13. As shown in FIG. 7, the processor 7 reads out the observation condition file correspondent to the observation condition specified by the GUI, transmits the adjustment condition of the charged-particle optical system described in the file to the charged-particle microscope device 11, transmits the adjustment condition received by the upper control device 12 in the charged-particle microscope device side to the control circuit 13, makes a DA conversion, generates the control current or the control voltage to the charged-particle optical mirror body, and supplies that to the charged-particle optical mirror body, and the observation condition change processing is basically executed, thereby.

However, since the observation condition file is described in the human understandable format, the contents of the observation condition file are required to be converted into the format which the upper control device 12 can understand. The charged-particle microscope system of the embodiment has a configuration to make the PC have this conversion function, to convert the contents of the observation condition file to the execution command of the upper control device 12, and to transmit the converted command to the microscope device side. Here, the command is a data protocol between the software (application program) to be installed onto the PC and the upper control device 12. The conversion function (hereinafter, named command conversion) to the command of the observation condition file is realized by installing the control software of the aforementioned charged-particle microscope device. In principle, it is possible to make the microscope device side have the conversion function, however, it is required to embed a general-purpose processor (CPU or the like) in the upper control device 12 or the control circuit 13, and it is not realistic in light of the demand of the cost reduction, therefore, in the embodiment, the conversion function to the command of the observation condition file is held on the PC side as a form of an application program. This application program is delivered to users or distributed to the market as a form stored in the recording media such as the CD-ROM or the USB memory.

FIGS. 8A-8C show the schematic drawings to describe the command concept in a form of tables. The command is conceptually expressed in the matrix (hereinafter, named command table) to arrange the adjustment item (for example, control parameters of the configuration element having the charged-particle optical system such as the acceleration voltage or the like) in the vertical direction and to arrange the set-up values of the correspondent adjustment items in the horizontal direction. On the command table shown in FIGS. 8A-8C, in the first line of the table, each of the adjustment items of the acceleration voltage, the filament current, the set-up current of the condenser lens, the set-up current of the alignment coil, and the set-up current of the astigmatism compensation coil is arranged from top in turn, and has a structure providing a 5-bit domain which is capable of storing the set-up value correspondent to each of adjustment items, in the horizontal direction. For better understanding, FIGS. 8A-8C also describe words such as "acceleration voltage" or "filament current" in the set-up item column of the first line, however actually, in the set-up item column, only the identifiers correspondent to each item are stored, and the words are not stored. The regulation to specify the information in which line of the command table corresponds to which set-up item is shared in the PC side and the upper control device 12 side, consequently, if the table is transmitted from the PC side to the microscope device side, the contents of the observation condition file can be transmitted.

The application program operated on the processor 7 reads out the observation file, thereafter, writes the set-up values of the set-up items which are read out from the file, to the table position correspondent to the set-up items described in the observation file. For example, if the set-up value which is read out from the observation condition file is a numerical value described in hexadecimal 5-bit code string of 8AB7F to the condenser lens and is zero to other set-up items, in the command table of PC side shown in FIG. 8A, a numerical value of "8AB7F" is written in the set-up value column of the condenser lens which is set up in the identifier=3, that is to say, the third line of the command table, and the numerical value of "0" is written in other set-up value columns. Incidentally, the numerical value data is described in binary or hexadecimal code string, accordingly, it is called argument in some cases.

Once the update work of the command table is completed, the processor 7 transmits the command table to the microscope device side via the communication terminal 9.

The upper control device 12 develops the data transmitted from the application program to the command reception table shown in FIGS. 8B-8C, and calculates the difference between the command table (FIG. 8B) received last time and the command table (FIG. 8C) received this time. Thereafter, it extracts the adjustment items having the difference between the command table received last time and the command table received this time, and adopts them as a configuration element of the charged-particle optical system which should change the operating condition.

Once the interpretation of the received command table is completed, the upper control device 12 calls the processing function correspondent to the configuration element which should change the operating condition, and generates the control signals to the control circuit 13 on the basis of the adjustment values which were read out. This processing is called the input and output control (I/O control).

In the timing chart shown in FIG. 7, after the command table transmitted from the application program (PC) side is interpreted by the upper control device 12, the necessity of the I/O control to the acceleration voltage is determined, first. In the case that the command table has the contents shown in FIGS. 8A-8C, the adjustment value of the acceleration voltage doesn't change, therefore, the I/O control to the acceleration voltage is not executed and the possibility of the I/O control to the filament current is determined. In the case that the I/O control to the acceleration voltage is required, the control signal to the acceleration voltage is generated and transmitted to the control circuit 13 side. The control circuit 13 side reads the adjustment value of the acceleration voltage from the received control signal, generates the analog control voltage signal in DAC, and supplies it to the cathode 17 or the anode 18 in the charged-particle optical mirror body. At the same time, once the acceleration voltage is confirmed to be changed to the prescribed value, the confirmation signal (Ack signal) is returned to the upper control device 12.

Hereinafter, in the same way, the necessity judgment of the I/O control for each item of the filament current, the condenser lens current, the alignment coil current, and the astigmatism compensation coil is executed by the upper control device 12 and the control signal is transmitted to the control circuit 13, as required. The execution sequence of the I/O control regarding each adjustment item is basically executed according to the description sequence of the observation items in the observation condition file, however, the information to show the adjustment sequence (the execution sequence of the I/O control) of each adjustment item may be described in the observation condition table.

As aforementioned, highly operable charged-particle microscopes which even beginners can easily operate are realized, by the microscope systems of the embodiment. Incidentally, in the description above, the observation condition files are supposed to be prepared in accordance with three of "surface", "regular", and "brightness", however, needless to say, the other observation conditions can be set up by increasing or decreasing the number of the observation condition file, as required. Furthermore, also needless to say, the application can be made not only to the low vacuum SEM, but also to the regular high vacuum SEM.

(Embodiment 2)

In this embodiment, the configuration examples of the charged-particle microscope having the correction function of the observation condition table are described. In the following description, the primary parts of the hardware and the software are supposed to be in common with the charged-particle microscope systems of the embodiment 1, and the description regarding the duplicated part is omitted.

The set-up values described in the observation condition table are basically utilized as initially set up default values as they are without being changed, however, in some cases, it is desired to change the set-up values described in the table, in the case of the time-dependent change (deterioration) of the charged-particle optical mirror body or the machine-dependent difference adjustment being performed. Therefore, this embodiment comprises the dialogue screen for the adjustment of the observation condition table, and it has been made possible to adjust the table contents, by calling the dialogue screen on the GUI, when the table is adjusted.

Figure 9A:
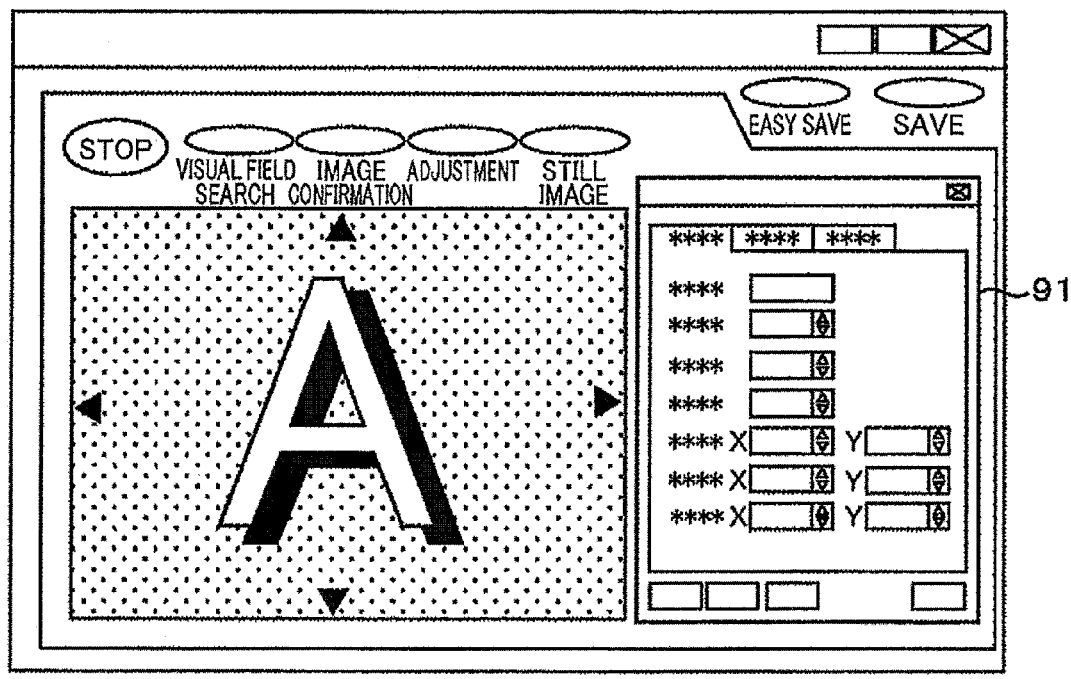
FIG. 9 is a drawing showing a configuration example of an adjustment screen of the charged-particle microscope system in the present invention.

FIG. 9 shows a configuration example of a change dialogue screen of the observation condition table displayed on the GUI of FIG. 3. The upper drawing of FIG. 9 shows the GUI screen of the condition in which the observation condition file adjustment dialogue screen 91 is called, and the lower drawing shows the enlargement of the observation condition file adjustment dialogue screen 91.

This embodiment has a configuration in which the dialogue screen shown in FIG. 9 cannot be directly called from the GUI and cannot be called without inputting the special command to call the adjustment dialogue screen after getting once back to the command prompt screen of the OS to operate on the personal computer. This is to prevent the users without having the professional knowledge from rewriting the observation condition tables arbitrarily. Moreover, the observation image and the dialogue screen are displayed on the same GUI, accordingly, the set-up values can be adjusted while the observation images are being watched.

In the observation condition file adjustment dialogue screen 91 of the embodiment shown in the lower drawing of FIG. 9, the set-up values are input directly in the set-up value input column 94 displayed in the screen, or by utilizing the pull down key 95. In the left of the set-up value input column, the set-up item display column 93 to show the names of corresponding set-up items is displayed. The numerical values which can be input to the set-up value input column 94 have the upper limit value and the lower limit value being provided and it is made impossible to input the inappropriate set-up values. Accordingly, it is possible to prevent the set-up of the excessive voltage values and current values over the device limit. These upper limit values and lower limit values are stored in the secondary storage device 6, read out upon the system boot-up, stored in the memory 8, and referred to by the GUI synthesis section shown in FIG. 1. Moreover, is possible to change the observation condition file for the adjustment by clicking the tab 92. The name of the tab 92 can be changed as required, and when being changed, the name of each button of the observation condition button 4 displayed on the GUI screen is synchronously changed. The aforementioned function on the GUI and the incidental screen display processing are all executed by the GUI control section of FIG. 3.

Basically, the dialogue screen for adjusting the observation condition file basically functions if there is a set-up value input column 94 corresponding to the description items of the observation condition file, however it is convenient if the following additional functions are provided.

Figure 9B:
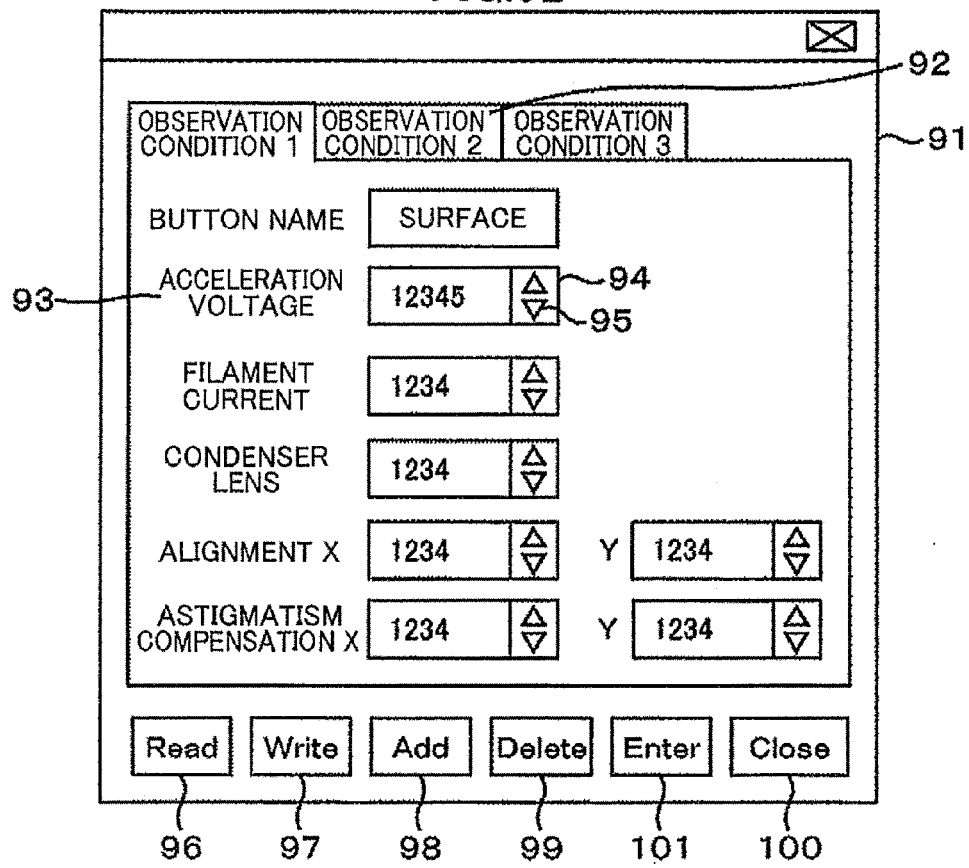

The dialogue screen of the embodiment shown in FIG. 9(B) displays only the set-up item display columns and the set-up value input columns of the acceleration voltage, the filament current, the condenser lens current, the alignment coil current, and the astigmatism compensation coil current which conform to the set-up items of the observation condition files of FIG. 5, however, it is also possible to add the set-up item display columns and the set-up value input columns for the configuration elements not aforementioned, by the operation of Add button 98. To the contrary, it is also possible to eliminate the set-up item display columns and the set-up value input columns which are not utilized, by the operation of Delete button 99. The elimination operation of the item display columns and the set-up value input columns is executed by pressing either of the set-up item display column or the set-up value input column after clicking Delete button 99, and then pressing Enter button 101.

The values of each charged-particle optical system condition of each observation condition being set up in the observation condition file adjustment dialogue screen 91 are written in the observation condition set-up table, held in memory 8 as reference data of the application program, and recorded in secondary storage device 6 by clicking Write button 97. By clicking Close button 100, the observation condition file adjustment dialogue screen 91 is closed, and the original GUI screen (screen shown in FIG. 3) returns. Here, the set-up values on the dialogue screen after completing the adjustment and the observation condition file are stored in the secondary storage device.

The dialogue screen of the embodiment is assumed to be utilized by engineers dispatched from the manufacturers for correcting the time-dependent change (for example, the replacement of the electron source or the like) of the microscope or correcting the machine-dependent difference. In such cases, it is convenient if the previous set-up values can be called and referred to. Accordingly, in the case to store the set-up values on the dialogue screen in the secondary storage device when either Write button or Close button is clicked, if the date-and-time data saving the set-up values after the change is also stored and Read button 96 is clicked, the previous set-up value list is made to be displayed in accordance with the date-and-time data. The user selects the set-up value of the date and time satisfying the intention from the displayed list and clicks Enter button 101, and the previous set-up value is displayed in the set-up value input column 94, thereby.

All of the aforementioned additional functions and the incidental screen display processing are also executed by the GUI control section of FIG. 3.

By the observation condition file adjustment dialogue screen of the embodiment, the charged-particle microscope system having the function to rewrite the contents of the observation condition file is realized, and it becomes possible to realize the charged-particle microscope system which can correspond to the time-dependent change, the machine-dependent difference adjustment or the like.

EXPLANATION OF REFERENCES 1 personal computer
2 GUI screen
3 observation image
4 observation condition button
5 observation condition table
6 secondary storage device
7 processor
8 memory
9 charged-particle optical mirror body
9, 10 communication terminal
11 microscope device
12 upper control device
13 control circuit
14 charged-particle optical minor body
15 sample chamber
16 charged-particle radiation source
17 cathode
18 anode
19 charged-particle beam
20 alignment coil
21 first condenser lens
22 second condenser lens
24 scan coil
25 astigmatism compensation coil
26 object lens
27 beam current diaphragm
28 BSE detector
29 observation sample
30 scattering electron
33 reset button
34 visual field movement button
41 surface button
42 regular button
43 brightness button
91 observation condition file adjustment dialogue screen
92 tab
93 set-up item display column
94 set-up value input column
95 pull down key
96 Read button
97 Write button
98 Add button
99 Delete button
100 Close button
101 Enter button

The invention claimed is:

1. A charged-particle microscope system, comprising:
a scanning charged-particle microscope, the scanning charged-particle microscope comprising: a charged-particle optical mirror body; and a control device for controlling the charged-particle optical mirror body;
a display screen for displaying a graphical user interface (GUI) comprising an observation image display domain in which an observation image in the charged-particle microscope is displayed; and
a computer for executing an operation indicated on the GUI,
wherein the GUI displays:
a start/stop button for switching on/off an acceleration voltage of the charged-particle optical mirror body;
a visual field search button for moving a visual field of the charged-particle microscope observation image displayed on the display screen;
an image confirmation button for displaying a higher resolution image than an image displayed where the visual field search button is clicked;
an adjustment button to be clicked when the charged-particle optical mirror body is adjusted;
a still image button for making an electron beam scan into a still condition in the charged-particle optical minor body; and
an observation condition button, the observation condition button comprising: a surface button; a regular button; and a brightness button,
wherein, when the visual field search button is clicked, a beam scan is executed that is faster than a beam scan executed when the image confirmation button is clicked, wherein when the adjustment button is clicked, a beam scan is executed that is faster than a beam scan executed when the image confirmation button is clicked, and a size of a beam scanning domain is set narrower than a size of a beam scanning domain set when the image confirmation button is clicked, wherein when the still image button is clicked, the beam scan becomes in the still condition, and the last scanned image is displayed on the observation image display domain, wherein when the surface button is clicked, the acceleration voltage is set lower than an acceleration voltage when the regular button and the brightness button are clicked, and a beam current amount is set smaller than a beam current amount set when the regular button and the brightness button are clicked, and wherein when the brightness button is clicked, the acceleration voltage is set higher than an acceleration voltage set when the regular button and the surface button are clicked, and the beam current amount is set larger than a beam current amount set when the regular button and the surface button are clicked.

2. The charged-particle microscope system according to claim 1, wherein a visual field movement button is displayed in the observation display domain, and when the visual field movement button is clicked, a visual field of the observation image is moved in a direction indicated by the visual field movement button.

3. The charged-particle microscope system according to claim 2, wherein a reset button for returning the visual field of the observation image moved by an operation of the visual field movement button to an original position is displayed on the graphical user interface.

4. The charged-particle microscope system according to claim 1, wherein the displays of the start/stop button are made to be switched according to the on/off condition of the acceleration voltage.

5. The charged-particle microscope system according to claim 1, wherein an observation magnification button for adjusting a visual field magnification of the observation image is displayed on the graphical user interface.

6. The charged-particle microscope system according to claim 1, wherein when the regular button is clicked, the acceleration voltage is set higher than an acceleration voltage set when the surface button is clicked, and the beam current amount is set larger than a beam current amount set when the surface button is clicked and is set smaller than a beam current amount set when the brightness button is clicked.

7. The charged-particle microscope system according to claim 1 , wherein when an energy dispersive X-ray analysis equipment is connected to the scanning charged-particle microscope, the brightness button is changed to analysis and displayed on the graphical user interface.

* * * * *